United States Patent
Saini et al.

(10) Patent No.: US 7,359,113 B2
(45) Date of Patent: Apr. 15, 2008

(54) SEMICONDUCTOR OPTICAL AMPLIFIER HAVING A NON-UNIFORM INJECTION CURRENT DENSITY

(75) Inventors: Simarjeet S. Saini, Columbia, MD (US); Jerry L. Bowser, Reisterstown, MD (US); Vincent K. Luciani, Mount Airy, MD (US); Peter J. S. Heim, Washington, DC (US); Mario Dagenais, Chevy Chase, MD (US)

(73) Assignee: Covega Corp., Jessup, MD (US)

( * ) Notice: Subject to any disclaimer, the term of this patent is extended or adjusted under 35 U.S.C. 154(b) by 0 days.

(21) Appl. No.: 11/346,526

(22) Filed: Feb. 2, 2006

(65) Prior Publication Data

US 2006/0268397 A1 Nov. 30, 2006

Related U.S. Application Data

(60) Provisional application No. 60/649,307, filed on Feb. 2, 2005.

(51) Int. Cl.
*H01S 3/00* (2006.01)
(52) U.S. Cl. .................................... 359/344
(58) Field of Classification Search ................ 359/344
See application file for complete search history.

(56) References Cited

U.S. PATENT DOCUMENTS

| | | | | |
|---|---|---|---|---|
| 4,359,776 A | * | 11/1982 | Acket et al. ............. | 372/46.01 |
| 4,907,055 A | * | 3/1990 | Shinada .................... | 359/344 |
| 4,910,571 A | * | 3/1990 | Kasahara et al. .......... | 257/94 |
| 5,471,335 A | * | 11/1995 | Nitta ........................ | 398/160 |
| 5,539,571 A | * | 7/1996 | Welch et al. .............. | 359/344 |
| 5,684,816 A | * | 11/1997 | Takagi ..................... | 372/44.01 |
| 5,723,028 A | * | 3/1998 | Poris ....................... | 204/230.7 |
| 5,805,627 A | * | 9/1998 | Kubota et al. ........... | 372/45.01 |
| 6,117,793 A | * | 9/2000 | Tang ....................... | 438/740 |
| 6,186,631 B1 | | 2/2001 | Behringer et al. | |
| 6,538,808 B1 | | 3/2003 | Tastavridis | |
| 6,597,497 B2 | * | 7/2003 | Wang et al. ............. | 359/344 |
| 6,650,675 B2 | * | 11/2003 | Sahara et al. ............ | 372/50.11 |

(Continued)

FOREIGN PATENT DOCUMENTS

JP 02250042 A * 10/1990

(Continued)

OTHER PUBLICATIONS

Saini, S. S., et al., A Semiconductor Optical Amplifier with High Saturation Power, Low Noise Figure and Low Polarization Dependent Gain Over the C-Band, 17th Annual Meeting IEEE Lasers and Electro-Optics Society (LEOS 2004), vol. 1, Nov. 8-9, 2004, pp. 102-103.

*Primary Examiner*—Deandra M Hughes
(74) *Attorney, Agent, or Firm*—Potomac Patent Group PLLC

(57) ABSTRACT

A semiconductor optical amplifier (SOA) with efficient current injection is described. Injection current density is controlled to be higher in some areas and lower in others to provide, e.g., improved saturation power and/or noise figure. Controlled injection current can be accomplished by varying the resistivity of the current injection electrode. This, in turn, can be accomplished by patterning openings in the dielectric layer above the current injection metallization in a manner which varies the series resistance along the length of the device.

15 Claims, 7 Drawing Sheets

U.S. PATENT DOCUMENTS

| | | | |
|---|---|---|---|
| 6,678,289 B2 * | 1/2004 | Kim .............................. | 372/20 |
| 6,714,344 B2 * | 3/2004 | Islam et al. .................. | 359/344 |
| 6,819,814 B2 * | 11/2004 | Forrest et al. ................ | 385/14 |
| 7,110,170 B2 * | 9/2006 | Lee et al. .................... | 359/344 |
| 2002/0057491 A1 * | 5/2002 | Dorgeuille et al. ......... | 359/344 |
| 2004/0218259 A1 * | 11/2004 | Hui et al. .................... | 359/344 |
| 2006/0215255 A1 * | 9/2006 | Akiyama ..................... | 359/344 |

FOREIGN PATENT DOCUMENTS

JP        03035224 A   *   2/1991

* cited by examiner

SEMICONDUCTOR OPTICAL AMPLIFIER HAVING A NON-UNIFORM INJECTION CURRENT DENSITY

RELATED APPLICATION

This application is related to, and claims priority from, U.S. Provisional Patent Application Ser. No. 60/649,307, filed on Feb. 2, 2005, of the same title, the disclosure of which is incorporated here by reference.

BACKGROUND

The present invention relates generally to semiconductor optical amplifiers and, more particularly, to semiconductor optical amplifiers having an injection current with a non-uniform density across the device.

Technologies associated with the communication of information have evolved rapidly over the last several decades. Optical information communication technologies have evolved as the technology of choice for backbone information communication systems due to, among other things, their ability to provide large bandwidth, fast transmission speeds and high channel quality. Semiconductor lasers and optical amplifiers are used in many aspects of optical communication systems, for example to generate optical carriers in optical transceivers and to generate optically amplified signals in optical transmission systems. Among other things, optical amplifiers are used to compensate for the attenuation of optical data signals transmitted over long distances.

There are several different types of optical amplifiers being used in today's optical communication systems. In erbium-doped fiber amplifiers (EDFAs) and Raman amplifiers, the optical fiber itself acts as a gain medium that transfers energy from pump lasers to the optical data signal traveling therethrough. In semiconductor optical amplifiers (SOAs), an electrical current is used to pump the active region of a semiconductor device. The optical signal is input to the SOA from the optical fiber where it experiences gain due to stimulated emission as it passes through the active region of the SOA.

The electrical pumping current is typically injected via an electrode. Consider, for example, the ridge-waveguide type SOA 28 structure illustrated in the cross-section of FIG. 1(*a*). Therein a multi-layer active (gain) region 30 is sandwiched between the substrate layer 32 and the residual cladding layer 34. Those skilled in the art will appreciate that any gain structure can be employed as active region 30, e.g., multiple quantum well separate confinement heterostructures and/or bulk materials can be used to fabricate gain section 30. Multiple quantum wells (not shown) may be provided in gain section 30 using various materials, e.g., InAlGaAs, InGaAsP and InP, to create gain section 30 using well known techniques. Separate confinement waveguiding layers (not shown) may be provided in gain section 30 using various materials such as InGaAsP. The substrate layer 32 and residual cladding layer 34 can be formed from, for example, InP. An etch stop layer 36 is disposed on top of the residual cladding layer 34. The ridge is formed from another InP layer 38 capped by a different semiconductor layer 39, for example InGaAs, and a current-confining dielectric layer 41. A contact opening is etched in the dielectric layer 41 and a metal electrode layer 40 is disposed on top of the dielectric layer 41 such that it makes contact with the top semiconductor ridge layer 39. Current is injected via electrode 40 into the SOA 28, so that gain is applied to an optical signal passing through the active region 30. However, gain is only applied in the pumped region 42 of the active region 30. Outside of the pumped region 42, where there is no pumping current, the optical signal suffers from energy absorption as it passes through the SOA 28. The input optical power Pin injected into the SOA 28 is amplified according to $P_{out}=G P_{in}$, where G is the single pass gain over the length L of the SOA 28 such that $G=e^{g_{net} L}$. The net gain $g_{net}$ is given by $g_{net}=\Gamma g-\alpha$ where $\Gamma$, g, and $\alpha$ are the optical confinement factor, the material gain and the optical loss, respectively.

The injection electrode can be fabricated along the length of the device as a metallization layer 40 contacting the top semiconductor ridge layer 39 by first removing dielectric material 41 prior to deposition of the metallization layer 40 as seen in FIG. 1(*b*). Therein, the dielectric material 41 is removed between the two dotted lines below the metallization layer to create the "T-shaped" contact shown in cross-section in FIG. 1(*a*). The injection electrode is connected to a current source or similar device to provide the injection current to the SOA 28. As can be seen from FIG. 1(*b*), conventional SOAs employ injection electrodes that have a uniform surface area across the waveguide, resulting in the injection current density being uniform across the length of the SOA 28. It should be noted that although the injection current density is uniform along the length of the SOA, the carrier concentration is not necessarily uniform due to variation in optical intensity along the length of the SOA. Also, the effects of the injected current are not uniform across the length of the device. For example, on the input side of the SOA 28, the effect of the injection current density on the noise figure (NF) of the SOA is of greater concern than the effect of the injection current density on saturation power ($P_{sat}$) of the SOA. On the output side of the SOA, by way of contrast, the effect of the injection current density on the $P_{sat}$ of the device is more important.

Accordingly, Applicants have developed SOA devices and methods which provide for control of the injection current and injection current density to, among other things, provide SOAs which have improved gain linearity, reduced crosstalk, and better efficiency through optimized current utilization.

SUMMARY

Systems and methods according to the present invention address this need and others by providing efficient SOA devices and methods of operating such devices. According to exemplary embodiments of the present invention, semiconductor optical amplifiers have an injection current density which is controlled to provide, among other things, both a low noise figure at the input stage of the device and a high saturation power at the output stage of the device. According to one exemplary embodiment, this can be accomplished by varying the electrical resistance of the injection electrode along the length of the device to achieve a non-uniform injection current density. More specifically, the injection current density can be increased at the input stage of the device and increased at the output stage of the device as compared to the center region of the device. According to an exemplary embodiment, this can be accomplished by providing a patterned opening of the dielectric layer below the metallization layer which provides a varying resistance along the length of the device.

For example, according to one exemplary embodiment of the present invention, a semiconductor optical amplifier includes a substrate, a gain section, disposed on the substrate, for providing gain to an optical signal, a current injection electrode for receiving current and providing the current to the gain section, wherein a current density associated with the current varies across a length of the gain section.

According to another exemplary embodiment of the present invention, a method for amplifying an optical signal includes the steps of providing a gain section on a substrate, injecting a pumping current into the gain section and varying a current density associated with the current across a length of the gain section.

BRIEF DESCRIPTION OF THE DRAWINGS

The accompanying drawings illustrate exemplary embodiments of the present invention, wherein.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

Devices and methods according to exemplary embodiments of the present invention provide semiconductor optical amplifiers whose overall efficiency of operation is improved. One challenge posed by conventional SOAs is that the gain of the device varies as a function of the power of the optical signal. It will be appreciated that as the applications for SOAs vary, so do the optical power levels. Accordingly, for system design purposes, it would be preferable to provide SOAs wherein the gain is relatively constant as a function of optical power levels. As mentioned earlier, the gain of an SOA can be expressed as a function of the material gain coefficient g. However, this gain coefficient varies as:

$$g = g_0/(1 + P/P\text{sat})$$

where P is the optical power in the SOA. Those skilled in the art will appreciate that increasing the saturation power of semiconductor optical amplifiers therefore has the resulting benefit of reducing gain variations relative to optical power. Accordingly, one of the objects of the present invention is to provide SOAs and methods of making SOAs which have increased saturation power relative to conventional devices. According to exemplary embodiments of the present invention, this can be accomplished by varying the injection current density along the length of the device, i.e., along the gain region of the device.

Figure 1A:
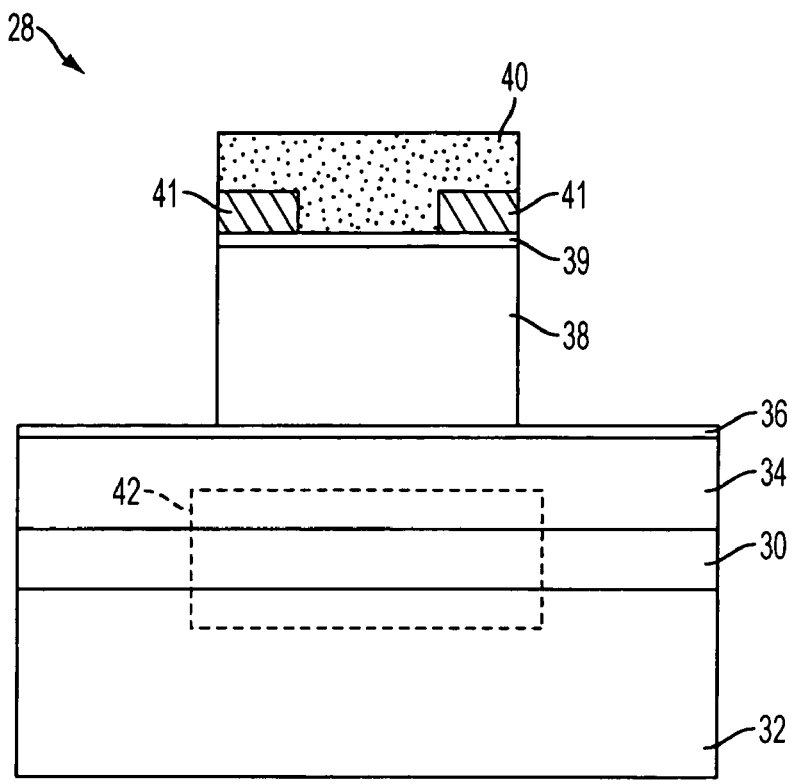
FIG. 1(a) is a cross-section of a ridge-waveguide type SOA in which exemplary embodiments of the present invention may be implemented.
Figure 1B:
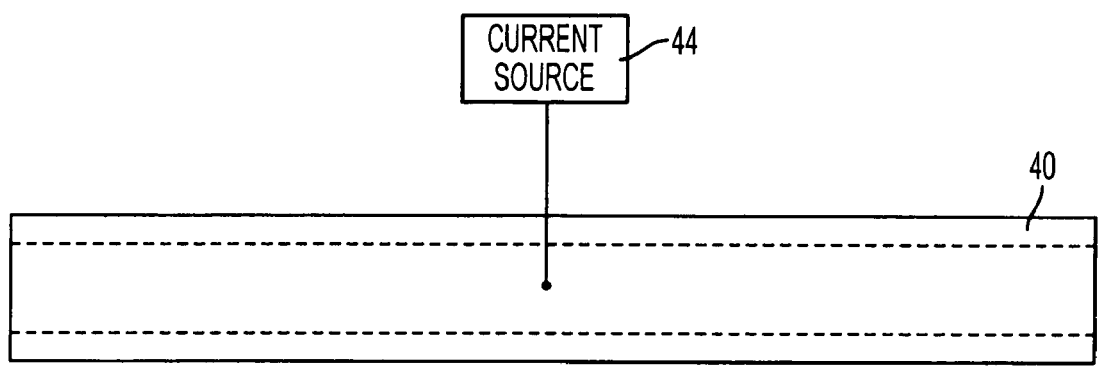
FIG. 1(b) is a top view of a conventional injection current electrode with a current source attached thereto.
Figure 2A:
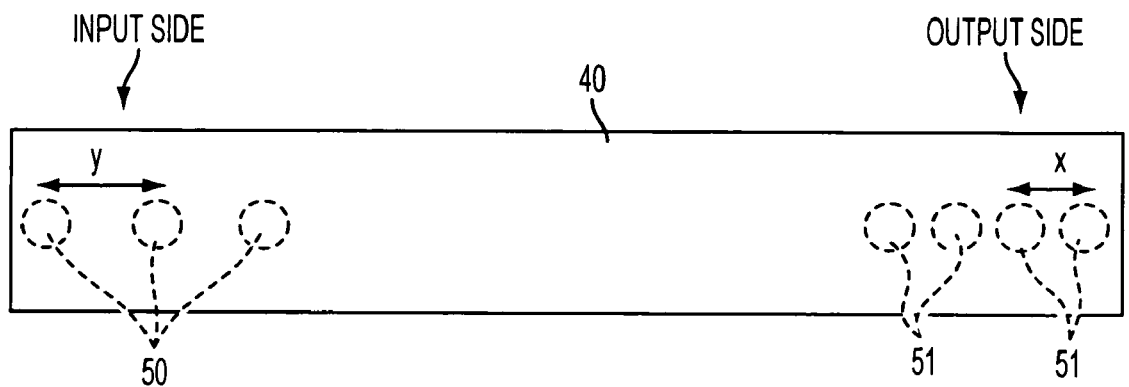
FIG. 2(a) is a top view of an injection current electrode according to an exemplary embodiment of the present invention.
Figure 2B:
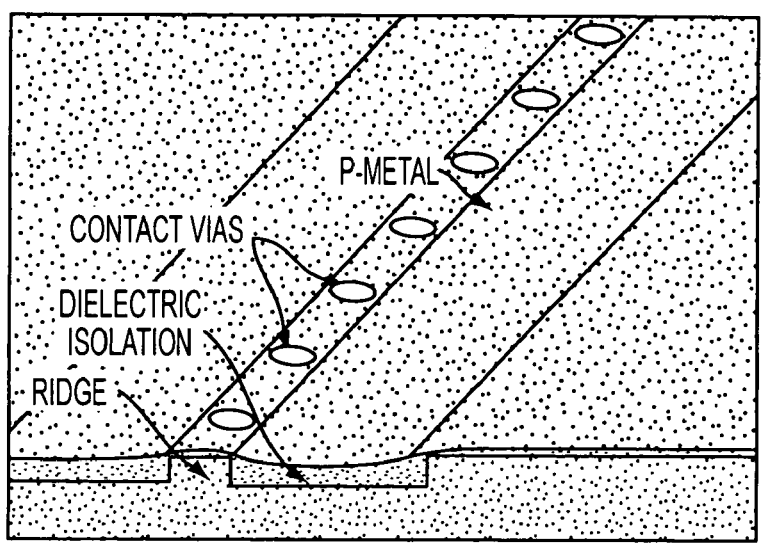
FIG. 2(b) illustrates a 3D perspective of a structure with patterned contact vias according to an exemplary embodiment of the present invention.

Varying the injection current density along the length of the gain region can be accomplished in a number of different ways. According to one exemplary embodiment of the present invention, this is accomplished by varying the series resistance in the injection electrode. By, for example, creating a tailored pattern of openings in the dielectric layer 41, as compared to the uniform rectangular opening depicted by the hidden lines in FIG. 1(b), the series resistance experienced by the injection current can be varied along the length of the device, resulting in a non-uniform injection current density. For example, as seen in FIG. 2(a), a plurality of contact openings 50, 51 can be provided in the dielectric layer 41 below the metallization layer 40 to expose portions of the semiconductor contact layer 39 therebelow. The metal electrode layer 40 is then deposited and only makes contact to the underlying semiconductor layer through the openings 50, 51 in the dielectric layer. Openings in dielectric layers through which current flows are often referred to as 'vias', hence the openings 50, 51 are called 'contact vias'. In this example, the openings are circular and have the same diameter, however the spacing between the openings varies from the input side of the device to the output side. More specifically, the spacing y between the openings 50 on the input side is greater than the spacing x between the openings 51 on the output side. A 3-D perspective view illustrating a structure with patterned contact vias according to an exemplary embodiment of the present invention is shown in FIG. 2(b). Those skilled in the art will appreciate that the contact vias can have an arbitrary shape (e.g. circular, rectangular, oval, octagonal) and that the size of the contact via can also vary along the device.

Figure 3:
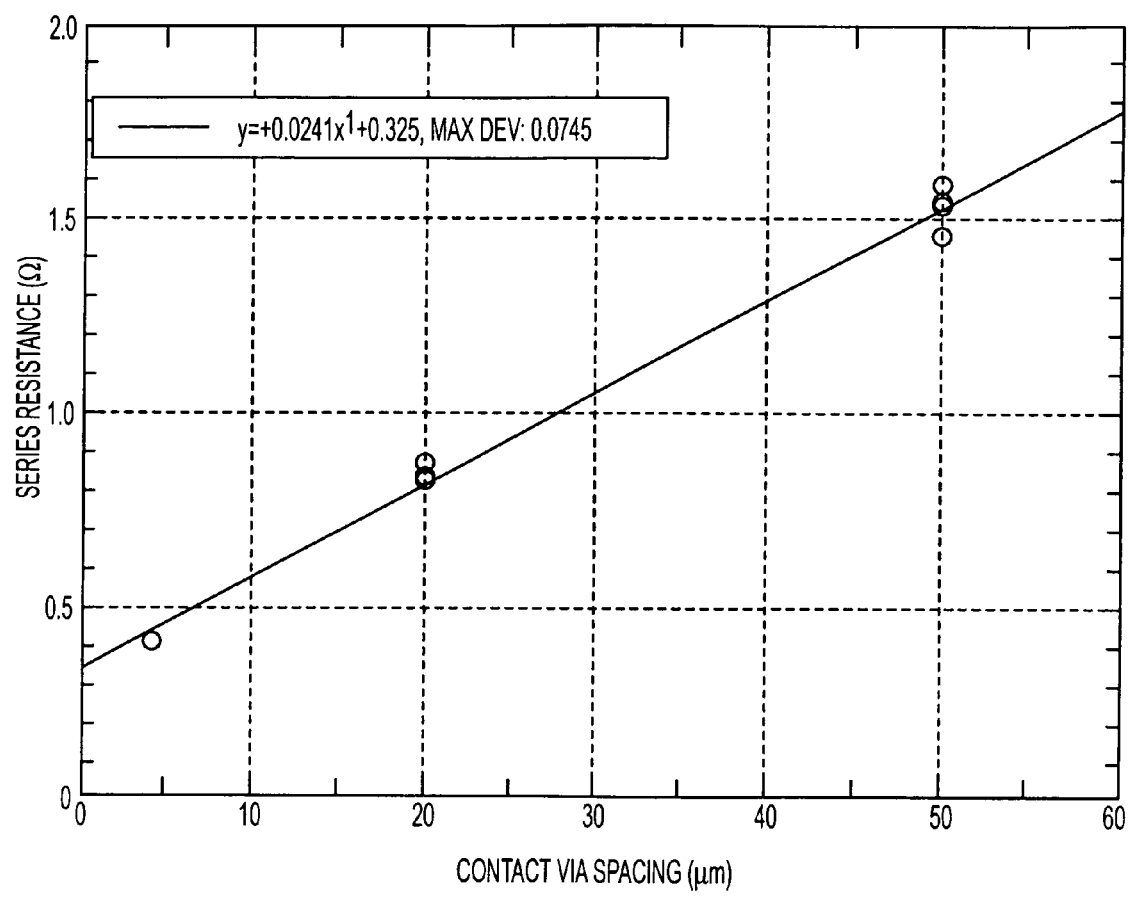
FIG. 3 is a graph showing an exemplary relationship between contact via spacing and series resistance of the contact electrode.
Figure 4:
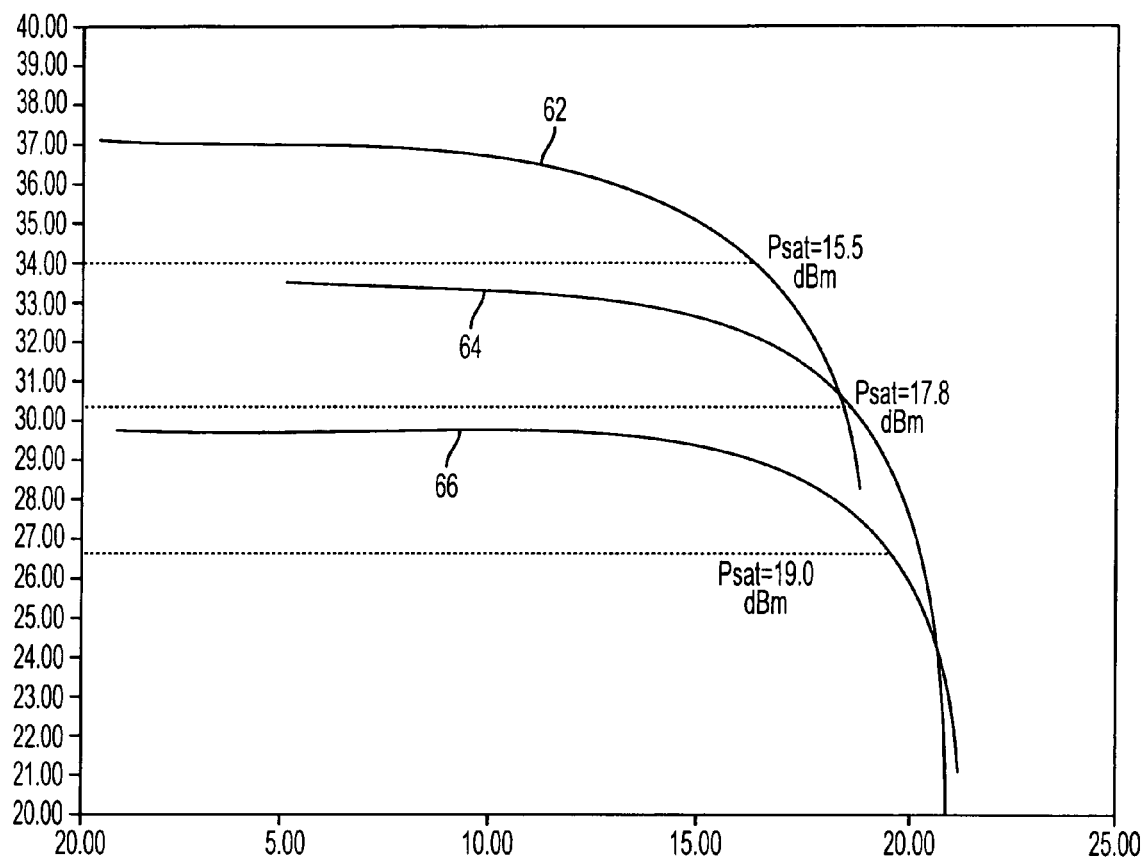
FIG. 4 is a graph showing exemplary relationships between saturation power and gain for a number of different contact via spacings.

In this example, the series resistance in the contact electrode varies linearly as a function of the contact hole spacing as shown by the graph of FIG. 3. These results were obtained on 2 mm long ridge-waveguide laser devices fabricated with 2.5 micrometer (μm) diameter contact vias with spacings that were uniform along the length of the device. The series resistance was measured for devices having contact vias with center-to-center spacing of 4, 20 and 50 μm as plotted in FIG. 3. Therein, ridge-waveguide type SOA were fabricated 2 mm in length with contact via spacing that varied linearly from 4 μm at the output side of the device to 20 and 50 μm at the input side of the device. Tests were performed to determine the impact of varying the resistance of the injection current electrode along the length of the devices with respect to saturation power. FIG. 4 shows results of these tests as they relate to gain and saturation power for a fixed injection current of 600 mA. The upper plot 62 represents testing of a ridge-waveguide type SOA having a conventional injection current electrode, i.e., of the type illustrated in FIG. 1(b), with a uniform injection current electrode resistance along the length of the device. From FIG. 4, it can be seen that the measured saturation power for this device was 15.5 dBm. Tests were also performed on devices in accordance with the present invention which were structurally the same as the device used to generate plot 62, with the exception that the resistance in the current injection electrode was varied along the length of the device. More specifically, plot 64 reflects the performance of a device wherein the contact via spacing was varied from 4 µm at the output side of the device to 20 µm at the input side of the device. This device was measured to have a saturation power of 17.8 dBm.

Plot 66 resulted from measurements taken from yet another similar device wherein the contact via spacing varied from 4 µm at the output side of the device to 50µ at the input side of the device. This device was measured to have a saturation power of 19.0 dBm. Thus, it can be seen that the larger range over which the contact via spacing is increased from the output side of the device to the input side of the device, the greater the resulting saturation power of the device for the same value of injection current. In this example the center-to-center spacing between contact vias varied linearly along the length of the device, however, those skilled in the art will appreciate that other distributions can be used such as an exponential or parabolic variation of the via spacings along the length of the device.

Figure 5:
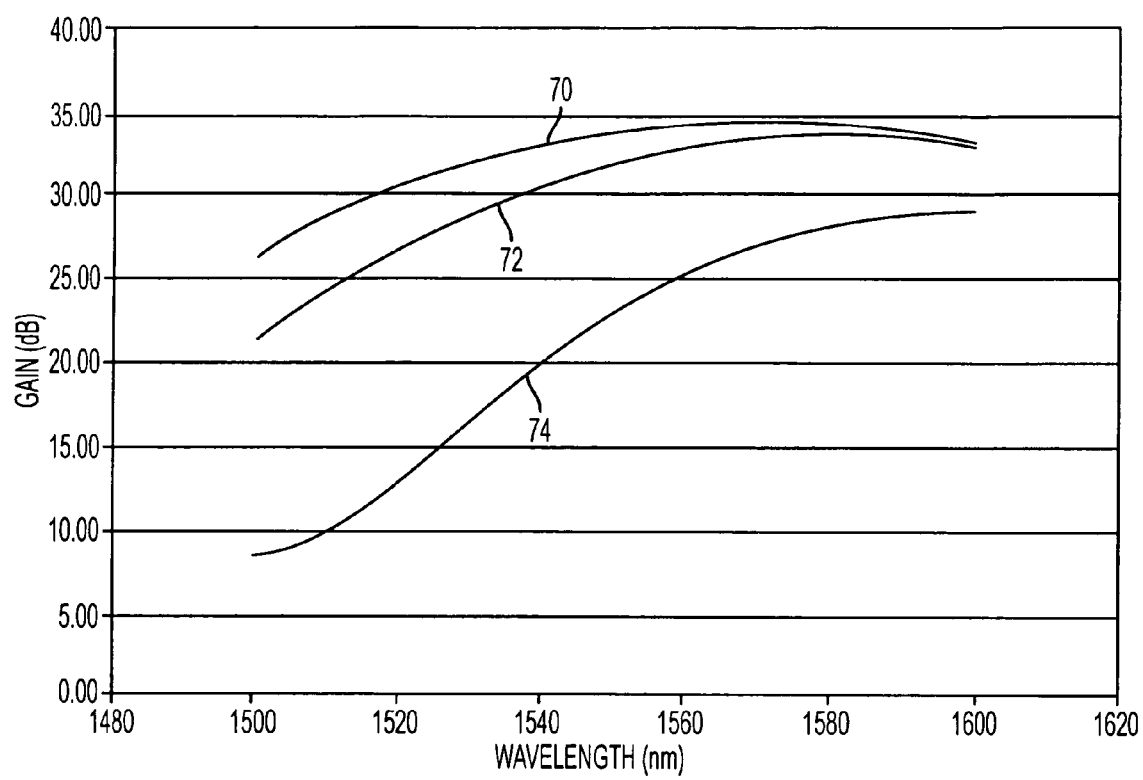
FIG. 5 is a graph depicting exemplary SOA gain as a function of wavelength for different contact via spacings.

However, Applicants have also realized that increasing the saturation power of SOAs using this exemplary technique has some tradeoffs. More specifically, as seen in the graph of FIG. 5, it can be seen that the small-signal gain of SOA devices according to the present invention is less than that of conventional devices having a uniform current electrode resistance. Therein, the curve 70 represents the small-signal gain for conventional devices across the wavelength spectrum from 1500 nm to 1600 nm. It can be seen that curve 70 is above both curves 72 and 74, which represent the gain vs. wavelength plots for devices having a contact hole spacing of 4-20 microns and 4-50 microns, respectively. Thus there is a tradeoff between increasing the saturation power of SOAs in the manner described above and reducing the small-signal gain of such SOAs. One solution is to increase the length of the device to offset the reduction in gain.

Figure 6:
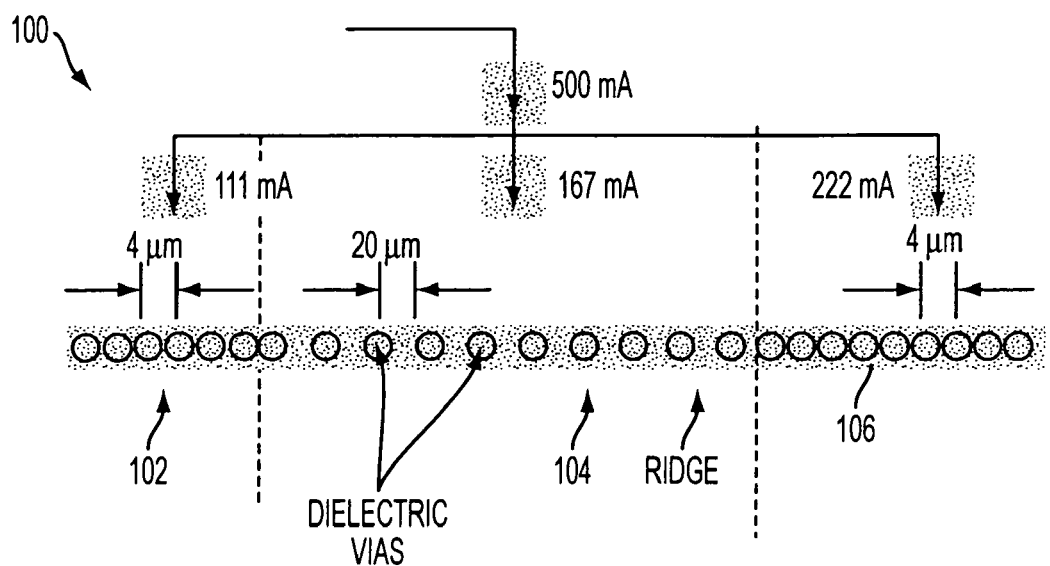
FIG. 6 is a top view of an injection current electrode according to another exemplary embodiment of the present invention.

However, for some applications, the device length may be constrained. Thus, another aspect of the present invention involves, for example, selecting a contact hole spacing that provides increased saturation power with an acceptable small-signal gain while also decreasing the noise figure. Accordingly, another exemplary embodiment will now be described with respect to FIGS. 6-9. In this example, the active region of the SOA includes a thin tensile strained bulk region in a separate confinement hetero-structure (SCH). The thickness of the active region is such that it will increase the saturation power of the device, while the tensile strain was adjusted to decrease the polarization dependent gain (PDG). Since, this exemplary device does not have mode expanders at the input and output, the SCH thickness is selected to provide high gain while keeping the ellipticity of the mode less than two in order to reduce the coupling losses using aspheric lenses. In this example, the SOA is 1.5 mm long and fabricated using ridge-waveguide processing similar to FIG. 1(a). The ridge width in this exemplary device is 3.2 µm. The waveguide is angled at six degrees relative to the facet to reduce reflections, and the facets are anti-reflection coated. As shown in FIG. 6, the continuous metal electrode contact layer 100 of the device includes three sections. The first section is a pre-amp section 102 which includes, in this exemplary embodiment, 4 µm contact via spacing. A gain section 104 follows the pre-amp section 102 and has, in this exemplary embodiment, 20 µm contact via spacing. Then, after the gain section 104, the contact layer 100 has a power amp section 106 with the contact vias spaced 4 µm apart from one another. The length of the pre-amp, gain and power amp sections in this purely illustrative exemplary embodiment are 265 µm, 750-µm and 485 µm, respectively for a total device length of 1.5 mm. In this exemplary embodiment, a separate pre-amp section is used to reduce the SOA noise figure (NF) since the overall NF of an amplifier is determined primarily by the NF of the first stage. The NF of an SOA decreases sharply with injection current as the bias increases beyond the transparency current and becomes independent of injection current when biased at approximately 4-5 times the transparency current. Hence, by increasing current density in the input section of a device, the overall NF is reduced. The power-amp section 106 is provided in order to increase the saturation power of the device by injecting a larger amount of current than in the gain section 104.

Figure 7:
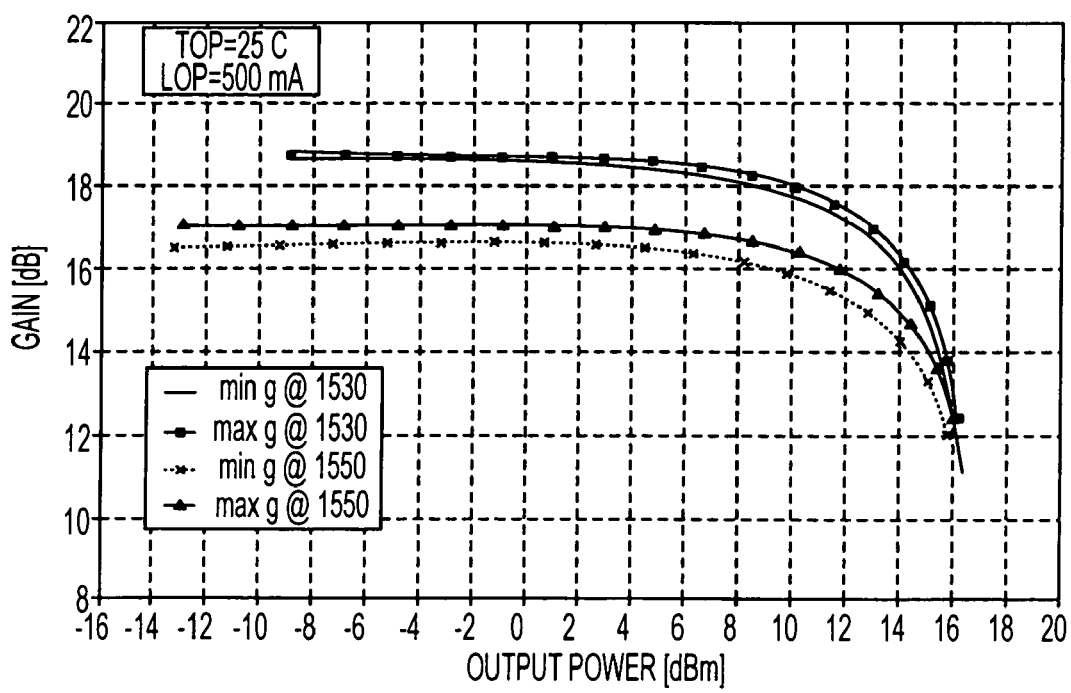
FIG. 7 is a graph depicting exemplary SOA gain as a function of output power for a device including the injection current electrode illustrated in FIG. 6.

According to the purely illustrative example shown in FIG. 6, it is estimated that for a 500 mA drive current approximately 111 mA is injected in the pre-amp section, 167 mA in the gain section, and 222 mA in the power-amp section. This non-uniform current distribution can be achieved using a single contact electrode and current source. Devices having the exemplary contact electrode layer 100 illustrated in FIG. 6 were evaluated for saturation power, gain, noise figure, and polarization dependent gain at an operating current of 500 mA and an operating temperature of 25° C. The input and output coupling was estimated to be less than 2 dB. FIG. 7 shows an exemplary gain versus output power curve for an SOA package including contact electrode layer 100. Therein, it can be seen that measurements were performed for maximum and minimum gain at 1530 nm and 1550 nm. The minimum saturation power of 14.6 dBm was measured at 1530 nm whereas the measured saturation power at 1550 nm was higher (greater than 15 dBm). FIG. 7 also indicates an increase in saturation power by approximately 0.5 dB per 20 nm increase in wavelength. The dependence of the saturation power on current was also measured and was observed to be linear with the operating current.

The noise figure for the exemplary SOA package was also measured by injecting a known input power and measuring the output optical signal to noise ratio close to the signal. The noise figure for a purely exemplary SOA device built in accordance with the contact electrode layer 100 was measured to be 5.5 dB at 1530 nm and 5.6 dB at 1550 nm. The dependence of noise figure on current was also evaluated. The noise figure dropped sharply with current around the transparency current and then remained nearly constant after approximately five times the transparency current.

Figure 8:
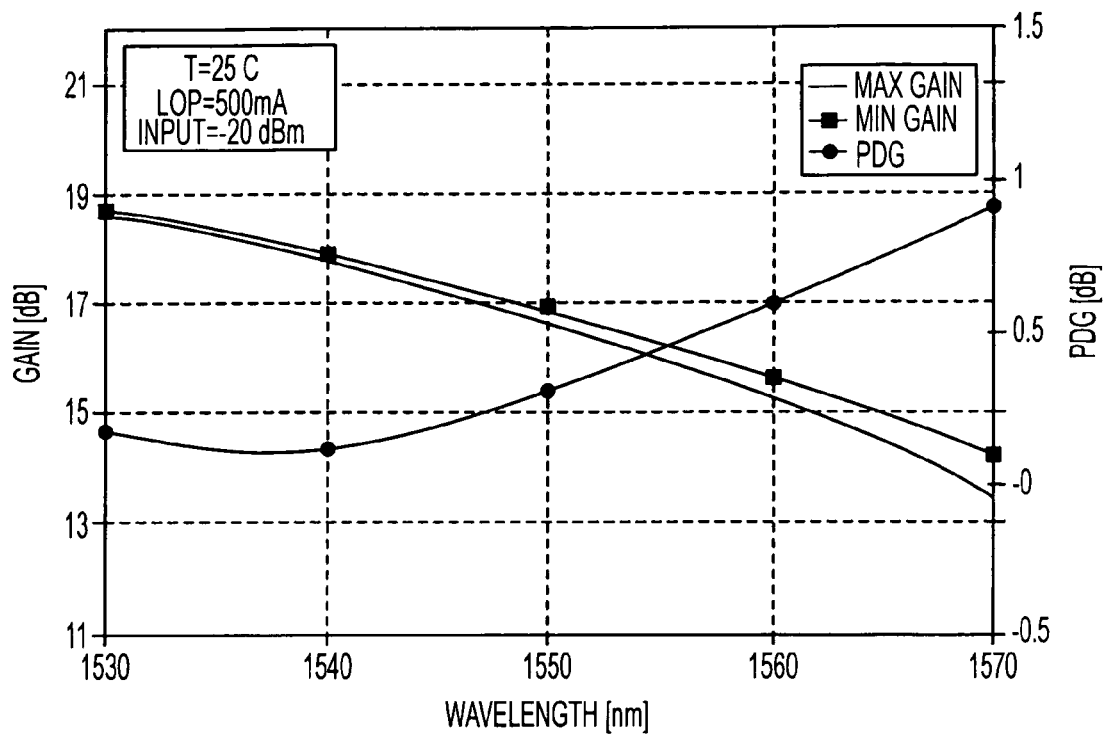
FIG. 8 is a graph depicting exemplary SOA gain as a function of wavelength for a device including the injection current electrode illustrated in FIG. 6.

FIG. 8 shows an exemplary gain versus wavelength curve for the same SOA package that was tested to provide the results shown in FIG. 7. Polarization dependent gain (PDG) is also plotted in the same figure. The PDG is less than 0.8 dB over the C-band from 1530 nm to 1565 nm. A maximum gain of 19 dB is achieved at 1530 nm. A gain flatness of 4 dB is achieved over the C-band. It should be noted that, for this test, the SOA was intentionally operated on the red side of the gain peak wavelength in order to increase the minimum saturation power and reduce the maximum noise figure in the C-band. If it is important to increase the gain flatness in a particular application, the peak gain wavelength can be increased by changing the composition of the bulk region.

Figure 9:
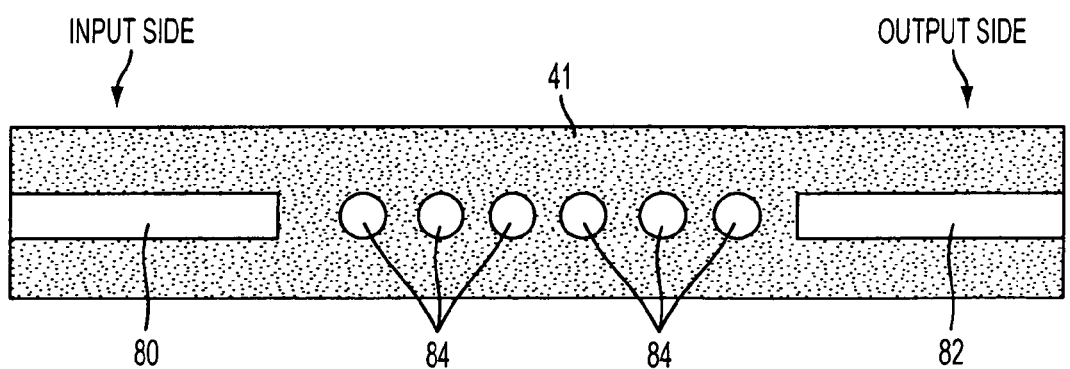
FIG. 9 is a top view of a ridge-waveguide type SOA according to another exemplary embodiment of the present invention.

According to another exemplary embodiment of the present invention, the current injection electrode can be fabricated as shown in FIG. 9. Therein, the input side and the output side of the device have contact pads 80 and 82, respectively, created by forming rectangular openings in the dielectric layer 41. Between the contact pads 80 and 82, a series of contact holes 84 can be provided. This exemplary embodiment of the present invention, as compared to the exemplary embodiment of FIG. 2, provides more injection current (lower series resistance) to the input section of the device. This, in turn, may be beneficial for applications where maintaining an acceptable noise figure (NF) of the SOA device is considered to be important, because the NF of an SOA benefits from having a relatively high injection current on the input side. The contact holes 84 may have the same or different sizes and may be equally spaced apart or have a spacing which varies, e.g., exponentially, from the input side to the output side of the device.

The above-described exemplary embodiments are intended to be illustrative in all respects, rather than restrictive, of the present invention. Thus the present invention is capable of many variations in detailed implementation that can be derived from the description contained herein by a person skilled in the art. For example, the present invention is not limited to patterning of only one contact electrode as a technique for varying the injection current density along the length of the device. More than one current injection electrode can be provided. Additionally, or alternatively, variable resistance can be introduced below the metallization layer by etching or otherwise varying the resistance of the top semiconductor contact layer. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. A semiconductor optical amplifier comprising:
   a substrate;
   a gain section, disposed on said substrate, for providing gain to an optical signal;
   a current injection electrode for receiving current and providing said current to said gain section,
   wherein a current density associated with said current varies across a length of said gain section,
   wherein said current density varies across said length of said gain section as a result of a variable resistance associated with a layer beneath a metallization layer of said current injection electrode and wherein said current injection electrode includes said metallization layer and a dielectric layer, said dielectric layer having a plurality of openings formed therein wherein said plurality of openings are disposed in a pattern which creates said variable resistance to said current along said length of said gain section,
   wherein said plurality of openings are circular, each of said plurality of openings having the same diameter,
   wherein a spacing between each of said plurality of openings increases from an output side of said semiconductor optical amplifier to an input side of said semiconductor optical amplifier.

2. The semiconductor optical amplifier of claim 1, wherein said spacing increases exponentially.

3. The semiconductor optical amplifier of claim 1, wherein said diameter is 5 micrometers or less.

4. The semiconductor optical amplifier of claim 1, wherein said plurality of openings includes a first opening proximate an input side of said gain section, a second opening proximate an output side of said gain section and a plurality of third openings between said first and second opening.

5. A semiconductor optical amplifier comprising:
   a substrate;
   a gain section, disposed on said substrate, for providing pain to an optical signal;
   a current injection electrode for receiving current and providing said current to said gain section,
   wherein a current density associated with said current varies across a length of said gain section,
   wherein said current density varies across said length of said gain section as a result of a variable resistance associated with a layer beneath a metallization layer of said current injection electrode and wherein said current injection electrode includes said metallization layer and a dielectric layer, said dielectric layer having a plurality of openings formed therein wherein said plurality of openings are disposed in a pattern which creates said variable resistance to said current along said length of said gain section,
   wherein said plurality of openings includes a first section proximate an input side of said gain section with one plurality of openings spaced apart from one another by at least one first distance, a second section proximate an output side of said gain section with a second plurality of openings spaced apart from one another by at least one second distance and a plurality of third openings between said first and second sections, said plurality of third openings spaced apart from one another by at least one third distance, said at least one third distance being greater than said at least one first distance and greater than said at least one second distance.

6. The semiconductor optical amplifier of claim 5, wherein said current injection electrode includes said metallization layer and a semiconductor contact layer, said semiconductor contact layer having a plurality of openings formed therein.

7. The semiconductor optical amplifier of claim 5, including only one current injection electrode.

8. A method for amplifying an optical signal comprising the steps of:
   injecting a pumping current into a gain section;
   varying a current density associated with said current across a length of said gain section by providing a variable resistance associated with a layer beneath a metallization layer on said substrate; and
      wherein said metallization layer and a dielectric layer are disposed above said gain section, wherein said dielectric layer has a plurality of openings formed therein, wherein said plurality of openings are disposed in a pattern which creates said variable resistance to said current along said length of said gain section,
   wherein a spacing between each of said plurality of openings increases from an output side of said semiconductor optical amplifier to an input side of said semiconductor optical amplifier.

9. The method of claim 8, wherein said plurality of openings are circular, each of said plurality of openings having the same diameter.

10. The method of claim 8, wherein said spacing increases exponentially.

11. The method of claim 9, wherein said diameter is 5 micrometers or less.

12. The method of claim 8, wherein said plurality of openings includes a first opening proximate an input side of said gain section, a second opening proximate an output side of said gain section and a plurality of third openings between said first and second opening.

13. A method for amplifying an optical signal comprising the steps of:
   injecting a pumping current into a gain section;
   varying a current density associated with said current across a length of said pain section by providing a variable resistance associated with a layer beneath a metallization layer on said substrate; and
   wherein said metallization layer and a dielectric layer are disposed above said gain section, wherein said dielectric layer has a plurality of openings formed therein, wherein said plurality of openings are disposed in a pattern which creates said variable resistance to said current along said length of said gain section,
   wherein said plurality of openings includes a first section proximate an input side of said gain section with one plurality of openings spaced apart from one another by at least one first distance, a second section proximate an output side of said gain section with a second plurality of openings spaced apart from one another by at least one second distance and a plurality of third openings between said first and second sections, said plurality of third openings spaced apart from one another by at least one third distance, said at least one third distance being greater than said at least one first distance and greater than said at least one second distance.

14. The method of claim 13, further comprising the step of
   providing said metallization layer and a semiconductor contact layer above said gain section, wherein said semiconductor contact layer has a plurality of openings formed therein.

15. The method of claim 13, wherein said step of injecting a pumping current into said gain section further comprises the step of:
   injecting said pumping current into said gain section via only one electrode.

* * * * *